United States Patent [19]

Dugan

[11] Patent Number: 4,935,109
[45] Date of Patent: Jun. 19, 1990

[54] DOUBLE-CELL ELECTROPLATING APPARATUS AND METHOD

[75] Inventor: William P. Dugan, Glendora, Calif.

[73] Assignee: General Dynamics Corp., Pomona Div., Pomona, Calif.

[21] Appl. No.: 197,793

[22] Filed: May 23, 1988

[51] Int. Cl.$^5$ .......................... C25B 15/08; C25D 5/02
[52] U.S. Cl. ........................................ 204/15; 204/237; 204/238; 204/239; 204/269
[58] Field of Search .................. 204/15, 231, 237, 238, 204/239, 267, 269

[56] References Cited

U.S. PATENT DOCUMENTS

| | | | |
|---|---|---|---|
| 883,756 | 4/1908 | Steiner | 204/26 |
| 1,840,105 | 1/1932 | Kean | 204/269 |
| 2,162,942 | 6/1939 | De Rohden | 204/269 |
| 2,761,831 | 9/1956 | Luechauer | 204/297 W |
| 2,796,395 | 6/1957 | Roberts | 204/182.5 |
| 2,828,256 | 3/1958 | Gempe | 204/238 |
| 3,954,569 | 5/1976 | Vanderveer et al. | 204/15 |

OTHER PUBLICATIONS

Webster's Seventh New Collegiate Dictionary, 1963, p. 813.

Primary Examiner—T. Tung
Attorney, Agent, or Firm—Henry Bissell; Leo R. Carroll

[57] ABSTRACT

An apparatus and method are described for electroplating surfaces. The apparatus reduces the anode effect on current density, and is therefore particularly suitable for copper or nickel plating of fine-line metal circuitry. Current density regulation is achieved by separating the anode and cathode into separate cells and achieving electrolyte communication between the cells by providing a relatively high-impedance ion path. The preferred embodiment includes a siphon tube as an ion path and a pump and filter in a separate path to maintain electrolyte circulation between the cells.

35 Claims, 4 Drawing Sheets

DOUBLE-CELL ELECTROPLATING APPARATUS AND METHOD

BACKGROUND OF THE INVENTION

1. Field of the Invention

This invention relates to apparatus and methods for electroplating of metals and, more particularly, to an improved apparatus and method utilizing a double electrolytic cell arrangement for obtaining improved plating uniformity.

2. Description of the Related Art

The process by which electric current is passed through a substance to effect a chemical change is known as electrolysis. The chemical change is one in which the substance loses or gains an electron (oxidation or reduction). The process is carried out in an electrolytic cell, an apparatus consisting of positive and negative electrodes held apart and immersed in a solution containing positively and negatively charged ions. The substance to be transformed may form the electrode, may constitute the solution, or may be dissolved in the solution. Positively charged components of the solution travel to the negatively charged electrode (cathode), combine with electrons, and are transformed into neutral elements or molecules, becoming deposited as a plated layer on the basis metal (substrate). Negatively charged components of the solution travel to the other electrode (anode), give up their electrons, and are transformed into neutral elements or molecules, generally remaining in the solution. When the substance to be transformed is the electrode, the reaction is generally one in which the electrode dissolves into solution as it loses electrons to the external circuit. Electrolysis is used extensively in the deposition of metals from solution (electroplating).

In electroplating, a metal may be transferred to normally conductive surfaces (metals) or to non-conductive surfaces (plastics, glasses, etc.) after the latter have been made conductive by such processes as coating with graphite, conductive lacquer, electroless plating, or coating with metal vapor.

Although some metal coating procedures go back to ancient times, modern electroplating began in 1880 with Alessandro Volta's discovery of the voltaic pile, or battery, which made significant quantities of direct current electricity available. Soon thereafter the battery was employed in depositing lead, copper, and silver. A nodule of copper which had been deposited on a silver cathode could not be removed. In the same year, zinc, copper, and silver were deposited on themselves and on a variety of basis metals (the metals on which the plating is applied), such as gold and iron.

FIG. 1 illustrates a typical plating tank 2 containing copper sulfate ($CuSO_4$) solution 3. A dc source 4 supplies electric current which is controlled by a rheostat 5. When switch 6 is closed, the cathode bar 7, which holds the work 8 to be plated, is charged negatively. Electrons from the cathode bar 7 transfer to the positively charged copper ions ($Cu^{++}$), converting them to atoms of copper metal. These copper atoms become part of the cathode surface and constitute copper plating.

As shown in FIG. 1, the same number of sulfate ions ($SO_4^{--}$) are discharged on the copper anodes, thereby completing the electrical circuit. The sulfate ions form a new quantity of copper sulfate, taking copper from the anodes 9 that dissolves in the solution and restores it to its original composition. This procedure is typical of nearly all ordinary electroplating processes—the current deposits a given amount of metal on the cathode and the anode dissolves to the same extent, maintaining the solution uniformity more or less. If the balance is perfect and there are no side reactions or losses, an efficiency of 100% could possibly be realized at both the cathode and the anode.

It is possible to plate a wide variety of alloys of metals by mixing suitable solutions of different metals. In this way, plated brass can be made more or less indistinguishable from cast brass. It is also possible to deposit alloys or compounds of metals that cannot be produced by melting and casting them together. For example, tin-nickel alloy plate has been used commercially for its hardness and corrosion resistance, both of which are superior to that of either metal alone. Other common alloy plates include bronze, gold with varying properties such as different colors or hardnesses, and magnetic alloy plates of such metals as iron, cobalt, and nickel. The latter alloy plates are used for memory drums in computers. Solder plate (Sn—Pb) is used in printed circuit work.

While non-metallic materials have been plated since the mid 1800s, a period of burgeoning growth in the use of electroplated plastic began with the introduction of suitable plastics such as acrylonitrile-butadiene-styrene. The utilization of plated plastics has grown enormously in recent years. The plastic part is first chemically etched and is then sensitized and activated. It is then coated with electroless copper or nickel before further plating. Although not comparable to the adhesion of metals to metals, a useful degree of adhesion is obtained in electroplating plastics.

There are innumerable applications for electroplating and electroforming in manufacturing. Uses of electroplating range from the silver plating of tableware and electrical contacts to the plating of zinc on steel articles to prevent their corrosion. Electroplating and electroforming are widely used for many purposes in the aerospace industry, especially in the fabrication of microcircuitry and small metal parts.

Obtaining a satisfactory result in electroplating requires the control of a variety of parameters. Particularly important among these are current density and distribution, temperature of the solution, diffusion velocity of the metallic ions, shape and structure of the electrodes, and the degree of agitation of the solution. Impurities in the electrolyte solution may also be adsorbed or deposited with the desired metal and may affect the ultimate properties of the plated metal. Because ion deposition does not occur uniformly, considerable attention has been devoted to developing apparatus and methods which allow the control of the various parameters that affect deposition.

Two factors which affect the distribution of current in electroplating are the location of the anode in the plating tank relative to the cathode, and the availability of fresh electrolyte solution at the cathode. It has long been recognized that for better uniformity a plating cell containing multiple anodes interspersed with cathodes can be employed. More uniform current density is achieved in this way, resulting in more uniform plating. Another method for accomplishing accurate deposition makes use of special rings comprising the anode which are fixed in position about the object to be plated.

The importance of anode position in electroplating is shown, for example, in U.S. Pat. No. 3,954,569. This patent discloses anode shields in a process for electroplating tubes or holes in printed circuit boards. By shielding the anode, the effective anode current density can be regulated to allow for uniform plating at the cathode.

The role of electrolyte concentration in the plating process is demonstrated by the buildup of metal deposition at the outer edges of a plated object. Efforts to control this phenomenon involve using "robbers" or "thieves," which are strips of metal situated around the edges of the object. The "robbers" or "thieves" are plated to reduce the excess plating of the edges. This process is expensive because of the extra metal required and additionally because extra power is consumed in the process.

Another method for minimizing the effect of electrolyte concentration at the cathode is to shield the object being plated by surrounding it with a non-conductive inert material. This essentially forms a cathode shield around the object and reduces the buildup of current density at the outer edges. The regulation of current density at the cathode is of key importance in effecting satisfactory plating. It is of crucial importance when objects having fine detail are being plated.

SUMMARY OF THE INVENTION

A double-cell plating apparatus and methods of using the same are disclosed herein. Apparatus in accordance with the invention comprises first and second cells filled with electrolyte, the first cell having an anode and the second cell a cathode situated therein, respectively. The two cells are physically separated, but electrolyte communication between the cells is effected by providing a siphon tube, bridge, or similar passage for allowing Cu ions to pass from the cell containing the anode to the cell containing the cathode while providing a return path for the electrolyte. The electrolyte is recirculated by a pump and filter apparatus with filter in a flow direction from the cell containing the anode to the cathode cell. In this way, the electrolyte in the cathode cell is maintained free of impurities which might otherwise be introduced by flaking of the anode, etc.

Regulation of the density of the current emanating from the anode is achieved by the physical separation of the cells. In an embodiment making use of a siphon tube, the effect of the anode on current distribution is reduced as a consequence of the passage of the electrolyte through the tube from one cell to another. The siphon tube acts as a relatively high-impedance ion path which efficaciously distributes current at the cathode. Since current density is a function of the physical dimensions of the siphon tube which bridges the two cells, particularly the length and diameter of the tube, by varying these dimensions the plating process can be controlled to achieve uniform plating. The apparatus and method described are particularly suitable for plating fine-line metal circuitry.

Several advantages are associated with utilizing a relatively high-impedance ion path such as a siphon tube. One advantage is that both sides of an object are plated equally well. There is no need to align the object preferentially with respect to the electrodes. This obviates the need for having multiple anodes in the same cell to surround the object being plated in order to achieve uniform plating from all sides. A further advantage is that the use of "robbers" or "thieves" to obtain uniform plating of fine-line circuitry is no longer necessary. In the present method, uniform plating is realized by positioning the circuit pattern in the center of a suitable panel. The dry film photoresist acts as a cathode shield. The elimination of "robbers" or "thieves" results in considerable savings in the amount of metal consumed in the plating process. The high resistance inherent in the present system results in low total current. A total current of about five milliamperes is employed for plating fine-line circuitry.

BRIEF DESCRIPTION OF THE DRAWINGS

A better understanding of the present invention may be realized from a consideration of the following detailed description, taken in conjunction with the accompanying drawing in which.

DETAILED DESCRIPTION OF THE PREFERRED EMBODIMENTS

Figure 1:
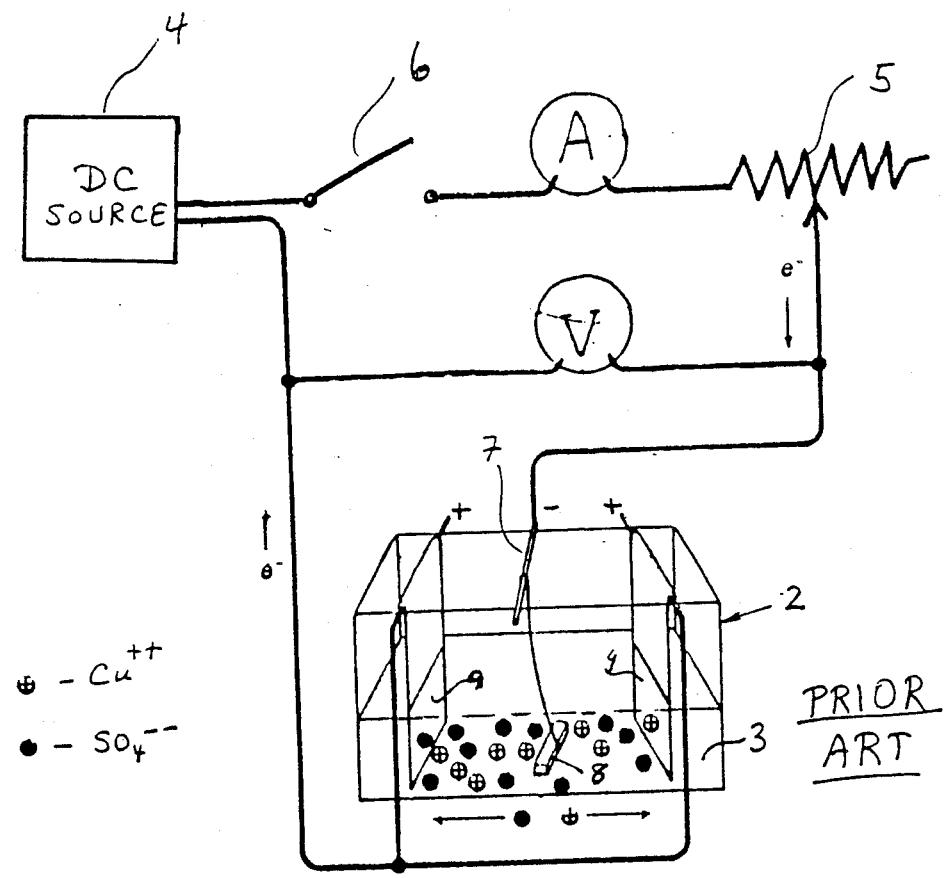
FIG. 1 is a schematic drawing of a conventional electroplating apparatus, described hereinabove.
Figure 2:
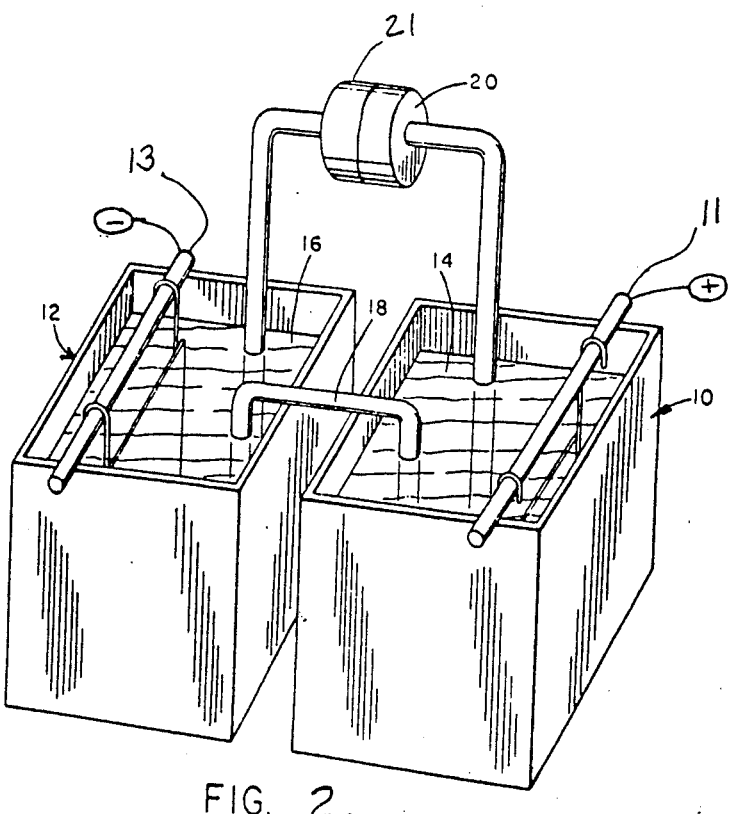
FIG. 2 is a perspective drawing of a simplified double-cell electroplating apparatus of the present invention.

FIG. 2 shows one possible arrangement of a double-cell electroplating apparatus according to the present invention. A first cell 10 has an anode 11 situated therein and a second cell 12 has a cathode 13 placed in it. Cells 10 and 12 are filled with electrolytic solution 14 and 16 in amounts sufficient to cover the electrodes. A wide variety of electrolytic solutions are usable, particularly solutions containing nickel or copper.

An example of a suitable copper plating solution is:

$CuSO_4.5H_2O = 70.166$ grams/liter
$H_2SO_4 = 184.643$ grams/liter
$Cl = 0.068$ grams/liter FIG. 2 further shows a tube 18 which connects cells 10 and 12 and performs as a siphon. The siphon tube 18 acts to pass electrolyte 14 from cell 12 to cell 10 while permitting the passage of ions between the cells in accordance with the potentials of the anode and cathode. While FIG. 2 reveals a single tube 18, it will be appreciated by those skilled in the art that multiple tubes could be used to achieve the same effect. It is important to note that what is being disclosed is not the mere use of a siphon, but rather a means of establishing a relatively high-impedance ion path between the two cells 10 and 12, cell 12 containing the cathode 13 and cell 10 containing the anode 11.

Also shown in FIG. 2 are a pump 20 and filter 21 installed in a common housing. The pump passes the electrolyte from cell 10 to cell 12, thereby effectively continuously recirculating, filtering and mixing the electrolyte 14 and 16. The last-mentioned function is important because during the electroplating process gas is evolved at the cathode 13 which may become trapped on the surface of the object being plated, and this can cause uneven deposition. By agitating the electrolyte 16, bubbles of gas can be kept from collecting.

An additional function of the pumping and filtering apparatus 20, 21 is to filter out anodal material, dirt, or other foreign matter present in the plating cells. It is desirable to filter the electrolytic solutions 14 and 16 to prevent roughness of the deposit due to extraneous materials in the solution. Although the use of a filter 21 associated with the pump 20 is one convenient way of achieving this end, the filtering device could be a separate part of the apparatus, placed in series with the pump 20. Similarly, a separate agitation means apart from the pumping apparatus 20 could be used to agitate the electrolytic solution.

Figure 3:
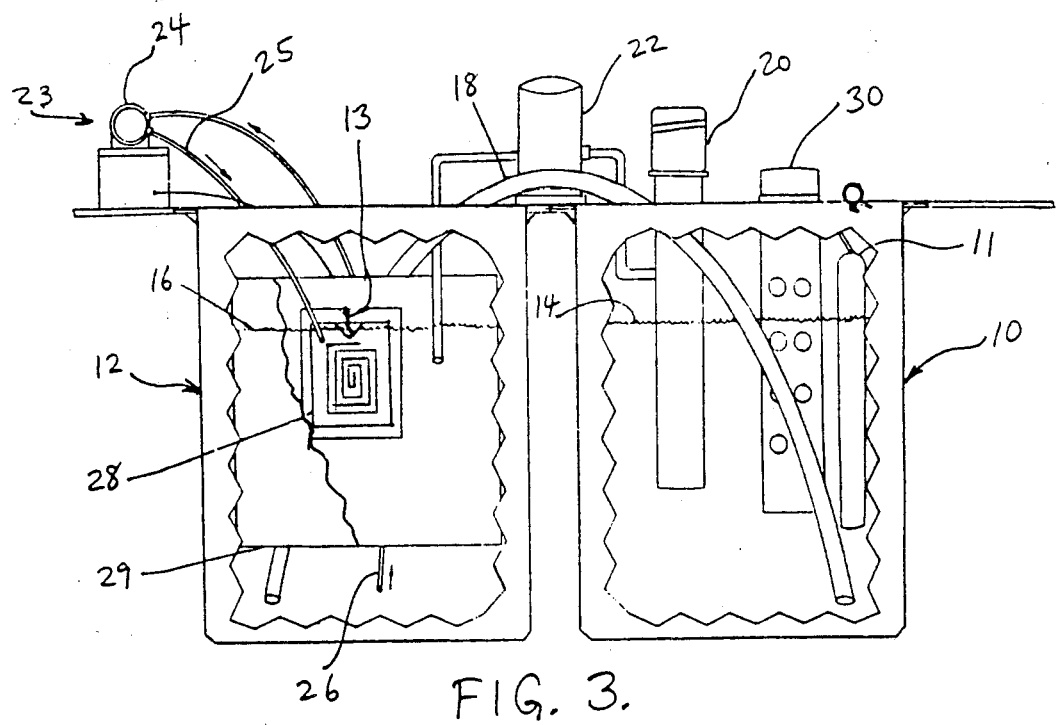
FIG. 3 is a partially broken away side view of one embodiment of a double-cell electroplating apparatus according to the invention.

FIG. 3 is a partially broken away side view of another possible double-cell electroplating arrangement in accordance with the present invention As before, a siphon tube 18 transports electrolyte 16 from cell 12 to cell 10 by siphoning action. Pump 20 pumps electrolyte 14 from cell 10 to cell 12. In the arrangement of FIG. 3, however, separate filtering means 22 and agitation means 23 are provided. Agitation means 23 takes the form of an additional pump 24 that circulates plating solution 16 through tubes 25 and 26. Intake tube 26 accepts electrolyte from the lower part of cell 12 which is pumped by the pump 24 through tube 25 to a part of the solution where fine-line circuit board 28 is attached to cathode 13. Circuit board 28 is partially surrounded by a plastic cathode shield 29, shown partially broken away. The shield 29 preferably has at least one opening (not shown in FIG. 3) on the same side of the circuit board remote from the siphon tube 18 which serves to diffuse the ion paths from the tube 18 to the object 28 being plated, thereby still further improving the quality of the plating layer.

An additional feature shown in the arrangement of FIG. 3 is the heater 30 situated in cell 10 to heat electrolytic solution 14. The temperature of the electrolytic solution 14 and 16 affects several of the factors in processes involved in electroplating, such as the solubility of metal salts and evolved gases and the rate at which chemical reactions take place.

Figure 4:
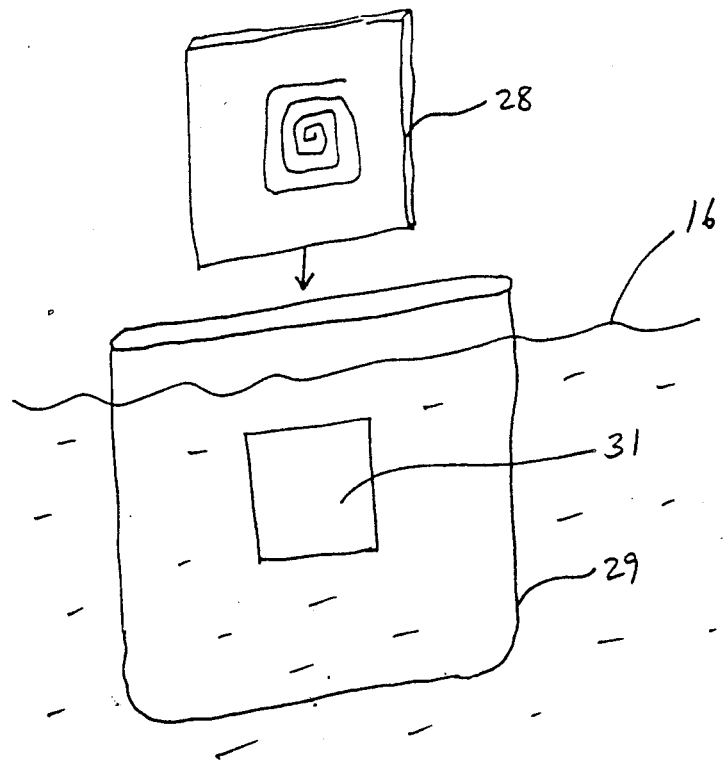
FIG. 4 is a perspective view of a cathode shield arrangement according to the invention.

FIG. 4 is a perspective view of the cathode shield 29 receiving circuit board 28. Cathode shield 29 comprises a plastic sleeve or envelope into which circuit board 28 can be inserted in preparation for plating. A window opening 31 on one side of cathode shield 29 allows electrolyte 16 to reach circuit board 28 when it is positioned in the center thereof. The arrangement is preferably oriented with the window opening 31 at the back, facing away from the other cell 10 and remote from the siphon 18.

While the arrangements of the dual-cell electroplating apparatus of the subject invention as shown in FIGS. 2 or 3 comprise two cells having a side-by-side relationship connected by a siphon tube, bridge, or the like to achieve electrolyte communication between the cells, it will be appreciated that there are other such configurations that can effectively result in anode current density redistribution. What all these configurations have in common is that they provide a relatively high-impedance ion transport path for ions migrating from anode to cathode in the plating process.

Figure 5:
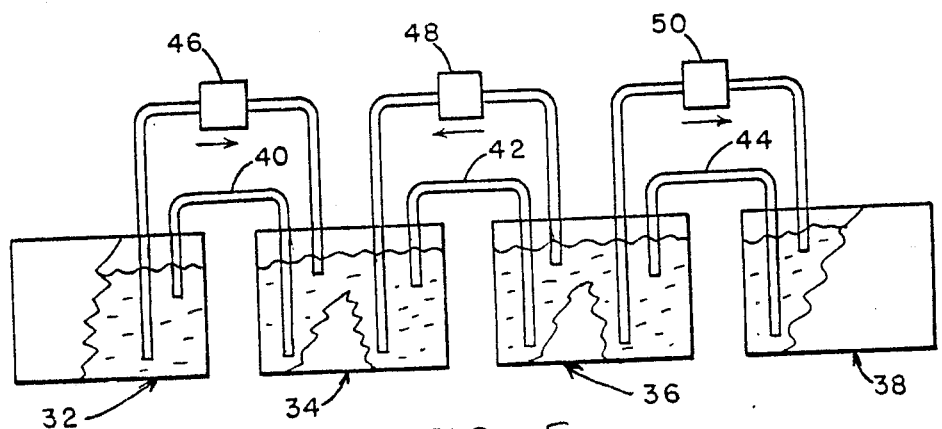
FIG. 5 is a partially broken away side view of a multiple cell arrangement.

One such arrangement provides several cells in series as shown in FIG. 5, which is a partially broken away side view of a multiple-cell arrangement. Cell 32 contains an anode electrode; cell 34, a cathode electrode; cell 36, an anode electrode; and cell 38, a cathode electrode. The tanks are connected in series via ion transport siphon tubes 40, 42, and 44 that provide paths for ions moving from one tank to an adjacent tank. Pumping apparatuses 46, 48, and 50 provide for electrolyte transfer from one cell to the next to keep the siphoning action going. Each pumping apparatus includes a filter to remove sediment, particles and other impurities from the electrolyte flowing into the cathode tanks, thereby improving the quality of the plating layer deposited by the process. The electrodes are not shown in FIG. 5, for simplicity, but each is connected to an external potential source, either positive or negative, in conventional fashion. The direction of flow through the pumping apparatus is always from an anode cell to a cathode cell. Thus the flow in pumping apparatus 46 and 50 is from left to right in FIG. 5, whereas the flow in pumping apparatus 48 is from right to left (anode cell 36 to cathode cell 34.)

Figure 6:
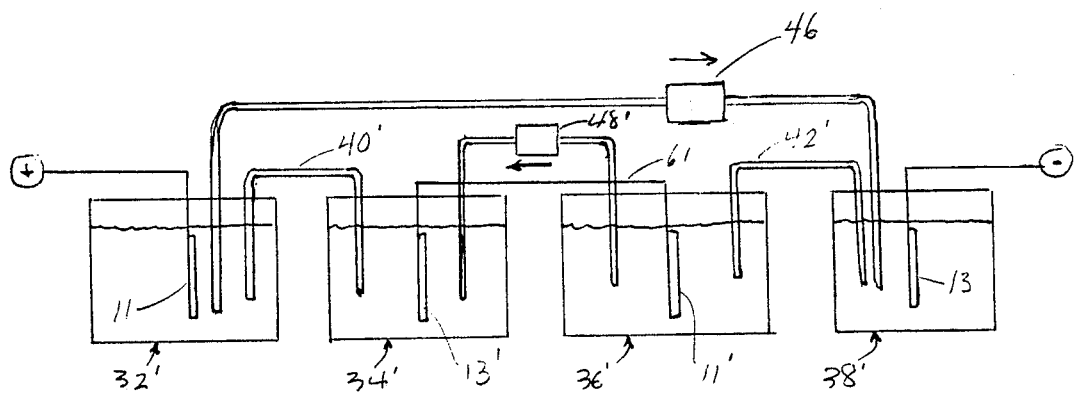
FIG. 6 is a similar view of an alternative arrangement to that of FIG. 5.

FIG. 6 depicts an alternative arrangement in which only the anode 11 in the left-hand cell 32' and the cathode 13 in the right-hand cell 38' are connected to external potentials. Anode 11' in cell 36' and cathode 13' in cell 34' are connected directly together by lead 61. Thus all of the cells are electrically in series so that exactly the same amount of material is removed from anodes 11, 11' and deposited on cathodes 13, 13'. Similarly, the electrolyte flow is in series through all of the cells, being pumped by pump/filter apparatus 46' from anode cell 32' to cathode cell 38' and by pump/filter apparatus 48' from anode cell 36' to cathode cell 34'. Siphon tubes 40', 42' complete the electrolyte flow path. It will be understood that the ions in the electrolyte migrate in accordance with the electrical potentials imposed on the system and can move contra to the direction of electrolyte flow. The plating process of the present invention was found in trials to proceed satisfactorily for a variety of different current densities. Particularly useful was an average current density of 20 amperes/ft$^2$ which produced a plated layer incrementation of about 0.001 inch per hour. Excellent results are also realized with a current density of about 125 amperes/ft$^2$.

The following example is described as typical of the materials and methods that can be utilized to achieve the methods of the subject invention. This example should not be construed as limiting the invention to the particular materials and methods described. Indeed, it will be readily apparent to those skilled in the art that numerous substitutions can be made without departing from the scope and spirit of the invention.

Example

Using the above-described plating apparatus shown in FIG. 2, it has been possible to plate circuit patterns on 12"×18" panels having right angles and 7-inch circuit lines. Plating was completed with a total current of one ampere to produce circuits that were uniformly plated to a thickness of 0.001 inch in one hour. It is expected that the same results can be achieved in about ten minutes with the increased current densities indicated above.

Figure 7:
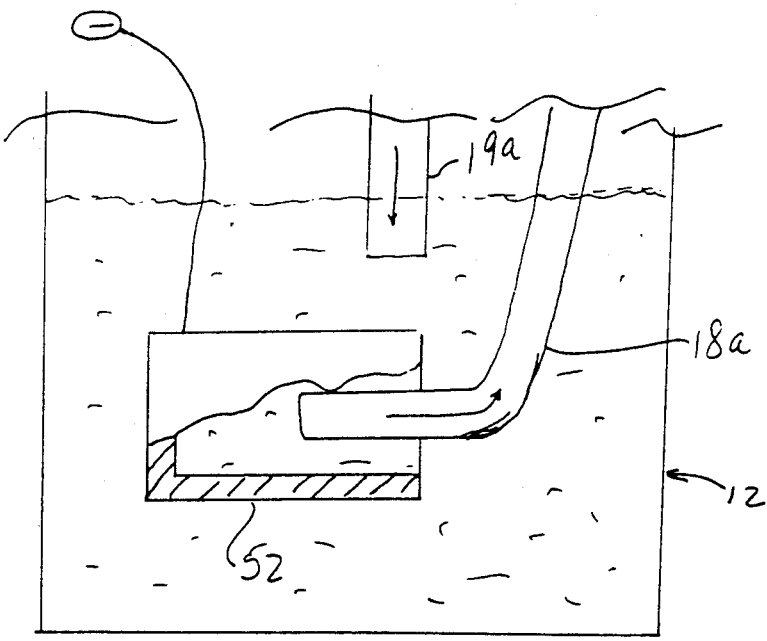
FIG. 7 is a schematic diagram, partially broken away, of another variant of the present invention.

It is also possible to achieve improved uniformity of plating of hollow objects with low migration of ions through a siphon tube to act as an internal anode by inserting the end of the tube inside a hollow cathode. Such an object is shown schematically in FIG. 7 in which a cathode cup 52 is submerged in a tank 12 as part of an electroplating system in accordance with the present invention. Siphon tube 18a is shown with its terminating end positioned inside the cup 52. Tube 19a extends into the tank 12 from a pump and filter apparatus, 20, 21 for example (see FIG. 2). The arrows indicate the direction of flow of electrolyte. It will be understood that the plating ions migrate in the direction of the cathode, irrespective of the direction of flow of electrolyte. Thus, in the illustration of FIG. 7, the plating ions are transported directly into the interior of the cup 52 to develop an improved uniformity of plating of the interior surface.

Although particular arrangements of a double-cell electroplating apparatus in accordance with the invention have been described above for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. Apparatus for electroplating an object comprising:
    a first container having at least one wall for holding an electrolytic solution therein;
    a second container having at least one wall for holding an electrolytic solution therein;
    anode circuit means in said first container for supplying ions of the metal to be plated;
    cathode circuit means in said second container for supplying electrons to said object to be plated; and
    a plurality of flow passages extending between said first and second containers for establishing electrolyte flow between said containers including means for limiting the rate of ion migration to produce uniform plating results, said passages comprising:
    transferring means for propelling electrolytic solution from said first container to said second container via a first one of said passages; and
    returning means for lifting electrolytic solution over the wall of said second container and directing it into said first container without resort to any pumping means.

2. The apparatus of claim 1 further comprising filtering means for filtering said electrolytic solution during transfer by said transferring means from said first container to said second container.

3. The apparatus of claim 1 further comprising agitation means for agitating said electrolytic solution in said second container and heating means for heating said electrolytic solution.

4. The apparatus of claim 1 further comprising cathode shield means surrounding said object to be plated in said second container, said cathode shield means having at least one opening to allow electrolytic solution to reach said object.

5. The apparatus of claim 4 wherein said cathode shield means comprise a plastic sleeve fitting over said object, said sleeve having means defining a side opening therein to expose said object therethrough to said electrolyte solution.

6. The apparatus of claim 5 wherein said sleeve is open at a top end and closed at a bottom end.

7. The apparatus of claim 1 wherein said transferring means comprises a pump and said returning means comprises a siphon tube.

8. The apparatus of claim 7 wherein the diameter of said siphon tube is reduced relative to the surface area of said solution in said second container in order to restrict the flow rate of electrolytic solution from said second to said first container.

9. The apparatus of claim 1 wherein said returning means comprise a siphon tube extending between the two containers and set up for flow of liquid therethrough under the influence of gravity, said siphon tube having a reduced diameter relative to the surface area of said solution in said second container in order to restrict the flow rate of electrolytic solution from said second to said first container.

10. Apparatus for electroplating material comprising:
    a first cell containing electrolyte;
    a second cell containing electrolyte;
    an anode in said first cell contacting said electrolyte;
    a cathode in said second cell contacting said electrolyte;
    first means for transporting said electrolyte from said first cell to said second cell;
    second means for lifting electrolyte from said second cell above the surface of electrolyte therein and directing said electrolyte to a point above the surface of electrolyte in said first cell and then returning said electrolyte to said first cell without reliance on any pumping means;
    means for contacting said material to be plated in said electrolyte in said second cell with said cathode; and
    means for passing current through said electrolyte in said first and second cells and in said first and second means for a time sufficient to plate said material.

11. The apparatus of claim 10 wherein said second means comprises a siphon.

12. The apparatus of claim 10 wherein said transporting means comprises a pump.

13. The apparatus of claim 12 further including a filter in series with said pump for purifying the electrolyte being transported into the cell containing the cathode.

14. The apparatus of claim 10 further comprising means for agitating said electrolyte in said second cell.

15. The apparatus of claim 14 further including means for heating said electrolyte.

16. The apparatus of claim 10 further comprising cathode shield means.

17. The apparatus of claim 16 wherein said cathode shield means comprise a plastic sleeve fitting over the material to be plated, said sleeve having a side opening therein to expose said material to be plated therethrough to said electrolyte solution.

18. A method of electroplating material comprising the steps of:
    (a) providing first and second cells containing an electrolyte;
    (b) situating an anode in said first cell and a cathode in said second cell, said anode and cathode each contacting said electrolyte;
    (c) lifting said electrolyte out of said second cell and transferring it through a first liquid passage in a first direction from said second cell to said first cell to a point above the electrolyte in said first cell and then passing the electrolyte into the first cell without resort to any pumping means, pumping and filtering said electrolyte through a different liquid passage in a second direction from said first cell to said second cell, the movement of said electrolyte in said first and second directions being simultaneous;

(d) immersing material to be plated in said second cell in electrical contact with said cathode; and (e) connecting said anode and said cathode to a source of electric current for a time sufficient to plate said material.

19. The method of claim 18 wherein the step of passing said electrolyte between cells in said first direction includes using a siphon tube.

20. The method of claim 18 wherein the step of passing said electrolyte between cells in said second direction includes pumping the electrolyte from said first cell to said second cell.

21. The method of claim 20 further including the step of filtering said electrolyte during pumping from the first cell to the second cell.

22. The method of claim 18 further comprising the step of agitating said electrolyte in the cell containing said cathode.

23. The method of claim 22 further comprising the step of heating said electrolyte.

24. The method of claim 18 further comprising the step of shielding said material with a cathode shield substantially surrounding said material and having at least one opening therein.

25. Multi-cell electroplating apparatus comprising:
a plurality of cells in separate containers, each containing an electrolyte solution, a first one of said cells containing a plating anode for supplying metal ions, a second one of said cells containing a cathode including an object to be plated;
means for supplying plating current in circuit with said cathode and anode; and
circulating means providing electrolyte flow paths between said cells including means devoid of any pumping means for lifting said electrolyte solution out of said second cell container to a point above the electrolyte in the first cell container and then transferring it to said first cell container.

26. The apparatus of claim 25 wherein said circulating means comprise a pump and filter for transporting electrolyte from the anode cell to the cathode cell and a siphon tube for returning electrolyte from the cathode cell to the anode cell.

27. The apparatus of claim 26 further including shielding means positioned between the circulating means and the object to be plated.

28. The apparatus of claim 27 wherein said shielding means comprise a non-conductive sleeve substantially surrounding the object to be plated.

29. The apparatus of claim 28 wherein said sleeve includes means defining an opening on the side of the object to be plated remote from the openings of the circulating means communicating between the anode and cathode cells.

30. The apparatus of claim 26 wherein said object to be plated includes an interior surface and the intake end of said siphon tube extends to the vicinity of said surface to direct plating ions to the interior of said object.

31. The apparatus of claim 26 wherein said plurality of cells comprises at least four separate cells, two pairs of anode cells and two pairs of cathode cells, and wherein the circulating means include means for circulating electrolyte between adjacent pairs of cells.

32. The apparatus of claim 31 wherein each electrolyte flow path from an anode cell to a cathode cell includes a pump and filter in series.

33. The apparatus of claim 26 wherein said plurality of cells comprises at least four separate cells, two pairs of anode cells and two pairs of cathode cells, and wherein the circulating means include means for circulating electrolyte in a first series path from a first cathode cell to a first anode cell to a second cathode cell to a second anode cell in that order and in a second series path from said second anode cell to said first cathode cell.

34. The apparatus of claim 33 wherein the second series path and the segment of the first series path extending from said first anode cell to said second cathode cell each include a pump and filter.

35. The apparatus of claim 33 wherein the means for supplying plating current is connected to only the cathode in said first cathode cell and the anode in said second anode cell.

* * * * *